United States Patent [19]

Thong

[11] Patent Number: 5,241,302

[45] Date of Patent: Aug. 31, 1993

[54] METHOD FOR DISPLAYING SIGNAL CHARACTERISTICS

[75] Inventor: Tran Thong, Beaverton, Oreg.

[73] Assignee: Tektronix, Inc., Wilsonville, Oreg.

[21] Appl. No.: 759,352

[22] Filed: Sep. 13, 1991

[51] Int. Cl.$^5$ ............................................. G09G 1/28
[52] U.S. Cl. .................................. 340/701; 340/703; 340/722
[58] Field of Search ...................... 340/701, 703, 722; 324/77 B, 78 D, 78 T, 78 Q

[56] References Cited

U.S. PATENT DOCUMENTS

| | | | |
|---|---|---|---|
| 3,634,759 | 1/1972 | Koshikawa et al. | 324/77 B |
| 3,961,217 | 6/1976 | Frischer | 340/722 |
| 4,032,912 | 6/1977 | Wood | 340/722 X |
| 4,039,956 | 8/1977 | Shimanek et al. | 340/722 |
| 4,295,093 | 10/1981 | Middleton | 324/77 B |
| 4,870,348 | 9/1989 | Smith et al. | 324/77 B |
| 5,065,147 | 11/1991 | Rice et al. | 324/77 B |

*Primary Examiner*—Ulysses Weldon
*Attorney, Agent, or Firm*—Francis I. Gray

[57] ABSTRACT

The present invention provides a method of displaying characteristics of a signal, where minimum amplitude of the signal during an interval is graphed versus time, maximum amplitude of the signal during the interval is graphed versus time, and the color or greyness of the area between the minimum amplitude graph and the maximum amplitude graph represents the average frequency during the interval of the amplitude measurements.

4 Claims, 3 Drawing Sheets

METHOD FOR DISPLAYING SIGNAL CHARACTERISTICS

BACKGROUND OF THE INVENTION

The present invention relates to the field of signal analysis, and more particularly to the display of signal characteristics in a single three-dimensional format.

Various instruments can monitor and analyze an input signal and display the characteristics of the input signal in a two-dimensional format, such as frequency versus time or power versus time. Further the amplitude may be indicated in terms of a maximum and minimum value during a particular time interval or a particular frequency range. For some signals more than two characteristics are needed to adequately describe the signal to an engineer. This requires displaying either a pair of two-dimensional displays simultaneously having different axes, or, as in the 3052 Spectrum Analyzer manufactured by Tektronix, Inc. of Beaverton, Oreg., displaying a succession of two-dimensional frequency versus amplitude displays in an historical display, such as a waterfall display.

The collection of data that includes three characteristics of the input signal, such as amplitude and frequency over time, provides an abbreviated frequency/amplitude history of the signal monitored. Such a history is a valuable aid to an engineer for detecting frequency and amplitude modulation, either intended or unintended, in a signal. A history is most valuable, however, if it is displayed graphically in a manner that allows an engineer to completely and efficiently detect the modulation. Also, if a history can be compactly represented, a number of histories can be placed on a single output device—be it a graphics CRT display, a printer or plotter, or any other device capable of displaying graphics—for comparison or for simultaneous inspection.

The 5371A Frequency and Time Interval Analyzer, manufactured by Hewlett-Packard Co. (HP), of Palo Alto, Calif., monitors and analyzes an input signal, compiling a collection of average frequency data. This product is described in more detail in "Product Note/Specification Guide—HP 5371A Frequency and Time Interval Analyzer", (Hewlett—Packard, 1988), which is hereby incorporated by reference. As with the Tektronix 3052 Spectrum Analyzer, each average frequency datum in the collection is the average frequency of the input signal during a separate sampling interval. The HP 5371A can measure the maximum amplitude of the input signal, but the measurement is free-running and therefore is not associated with a particular sampling interval.

The HP 5371A Frequency and Time Interval Analyzer does provide a method for displaying the signal characteristics that it can measure. For displaying average frequency, two methods are provided. The first is a graph of the time variation of frequency. The second method is a histogram, where each bin of the histogram represents a frequency range and the height of a rectangle within a bin represents the number of sampling intervals in which the average frequency of the signal falls within the range. Maximum signal amplitude, though of limited value for analyzing amplitude modulated signals, may be also graphed versus time.

Using the time variation graphs of the HP 5371A, it is possible to display the signal characteristics—average frequency, maximum amplitude, and minimum amplitude. Superimposing graphs of maximum amplitude versus time and minimum amplitude versus time onto a graph of average frequency versus time would allow an engineer to completely characterize the frequency and amplitude modulation behavior of a signal under analysis. However, this method would force an engineer to integrate data from several locations on a display and, furthermore, would not result in the compact representation desired.

Some instruments provide quasi-3-dimensional displays, as discussed above for the 3052 waterfall display. A waterfall display contains a number of planar amplitude versus frequency graphs, the graphs representing the frequency spectra of an input signal at different times. The graphs are stacked closely together, each amplitude versus frequency graph displaced upward and to the right relative to the newer one "in front of" it. Thus, older graphs appear to recede into the display. However, a frequency/amplitude versus time characterization determines a line, and the line lacks shape. Displacement of a line will not create the appearance of the line receding into the display.

Therefore, what is desired is a method of simultaneously displaying, in a compact representation, a collection of data characteristics representing the frequency and amplitude histories of a signal.

SUMMARY OF THE INVENTION

Accordingly, the present invention provides a method of displaying characteristics of a signal, where minimum amplitude of the signal during an interval is graphed versus time, maximum amplitude of the signal during the interval is graphed versus time, and the color or grayness of the area between the minimum amplitude graph and the maximum amplitude graph represents the average frequency during the interval of the amplitude measurements. The compact display of amplitude and frequency allows an engineer to more easily detect amplitude and frequency modulation contained in input signals. Due to the compactness of representation, many waveforms may be displayed at once.

The objects, advantages, and novel features of the present invention are apparent from the following detailed description when read in conjunction with the appended claims and the attached drawing.

DESCRIPTION OF THE PREFERRED EMBODIMENT

Figure 1:
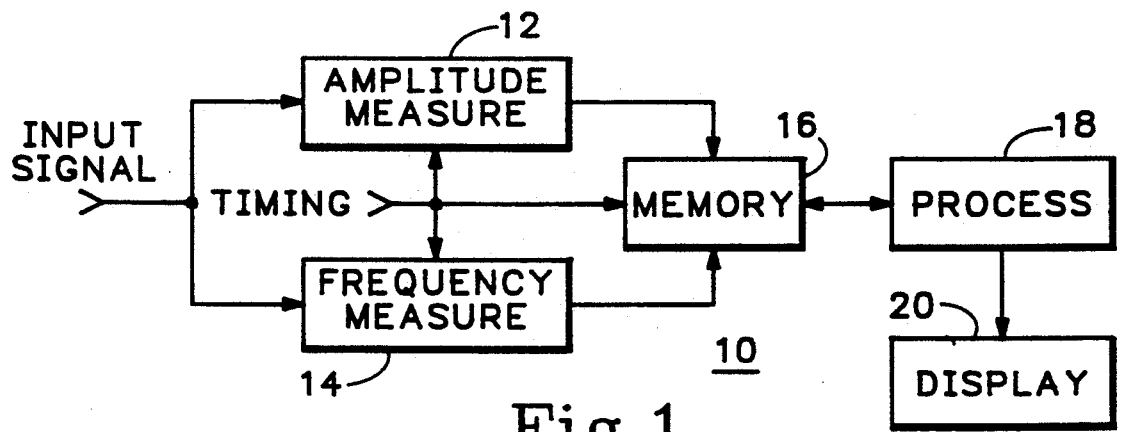
FIG. 1 is a block diagram view of a system for obtaining frequency and amplitude characteristics of an input signal versus time for use in the present invention.

Referring now to FIG. 1 a system 10 is shown having an instrument or circuit 12 for measuring amplitude of an input signal, such as a fast power meter, and an instrument or circuit 14 for measuring simultaneously the frequency of the input signal, such as the HP 5371A Frequency and Time Interval Analyzer referred to above. A timing signal from a conventional clock generator (not shown) synchronizes the amplitude and frequency measuring circuits 12, 14 to assure that the amplitude and frequency values are determined at the same time. The measurement values are stored in a memory 16. The memory 16 is accessed by a processor 18 to format the amplitude/frequency data values for display.

Figure 2:
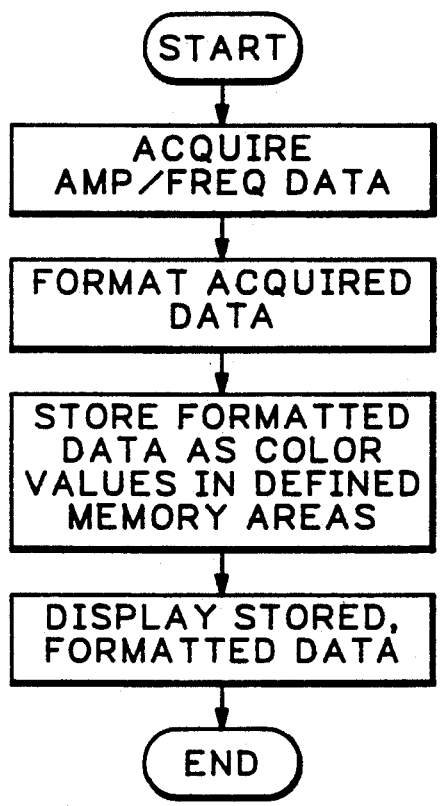
FIG. 2 is a flow chart view of a method according to the present invention for displaying as a single display frequency/amplitude histories.

As shown in FIG. 2 the processor 18 determines over a predetermined time interval maximum and minimum amplitude values as well as an average frequency value. The predetermined time interval identifies a range of column addresses for a display memory, or frame buffer, that may be part of the memory 16, and the min/max values identify a range of row addresses for the display memory. The average frequency value is converted into an intensity value that may be either a grey scale or a color value. The intensity value is stored in the address locations corresponding to the area defined by the column and row ranges. During a display cycle the data in the display memory is read out to the display 20 by the processor 18 in raster scan format.

Figure 3:
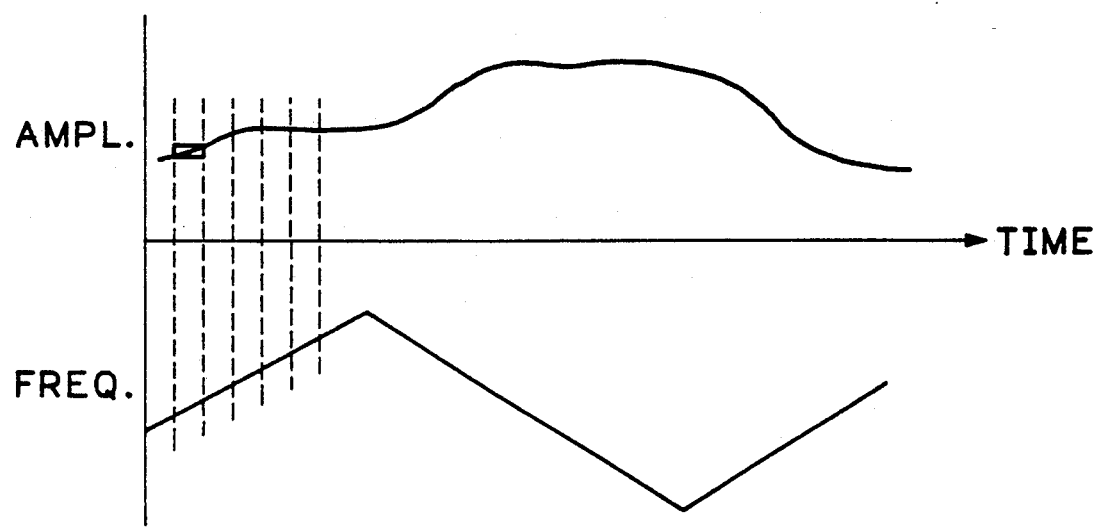
FIG. 3 is a graphic view of amplitude versus time and frequency versus time displays to be compacted according to the present invention.
Figure 4:
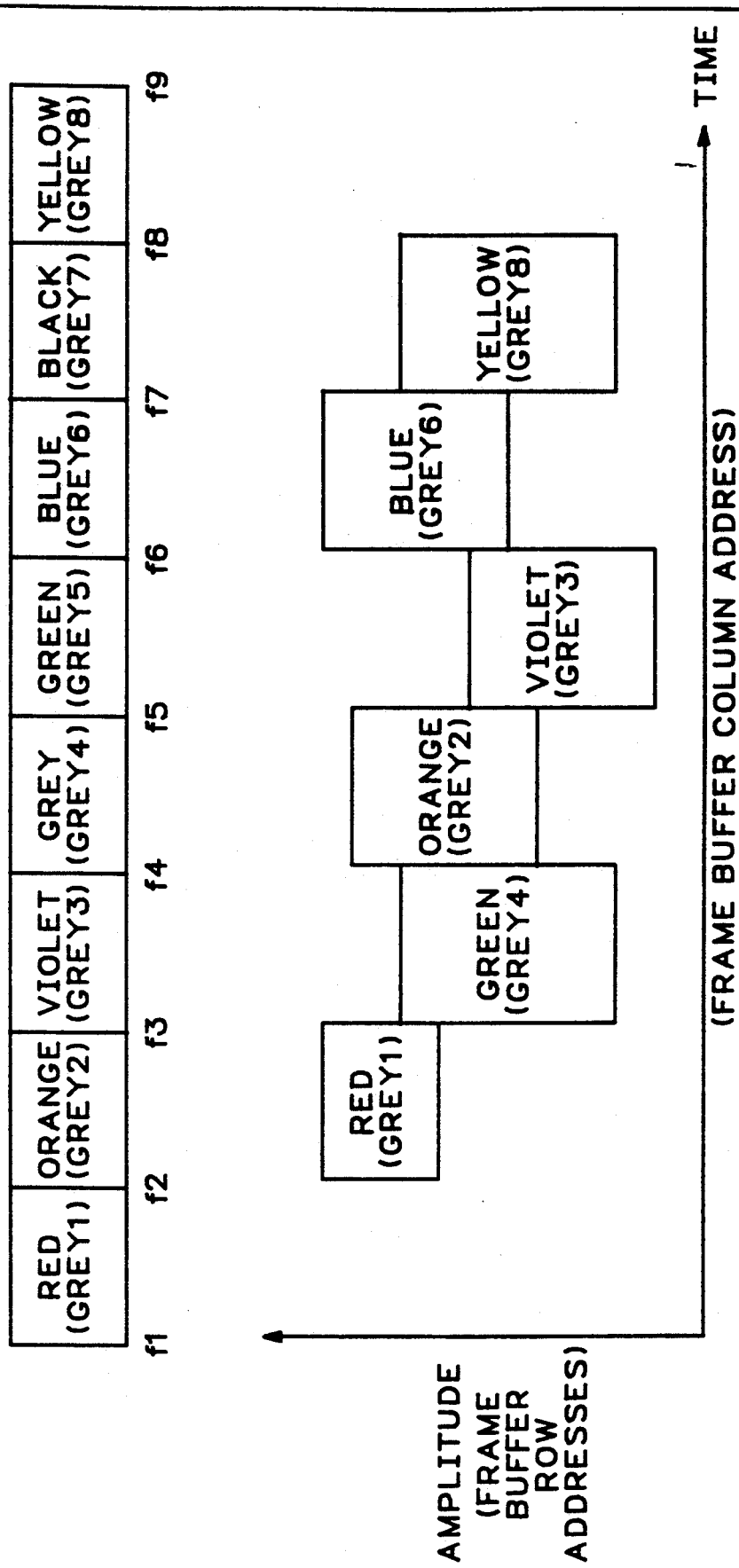
FIG. 4 is an illustrative view of a display produced according to the present invention.

The outputs of the amplitude and frequency measuring circuits 12, 14 appear as amplitude and frequency versus time signals as plotted in FIG. 3. The processor 18 divides the time scale into discrete time intervals as indicated by the dotted lines. During each interval the average frequency and min/max amplitude values are determined, and the result is displayed as shown in FIG. 4. A scale 30 indicates the frequency range for each color. For example the color "red" means an average frequency in the range between f1 and f2, "orange" means an average frequency in the range between f2 and f3, etc. The display presents a box for each time interval, the position and shape of which is determined by time interval and the minimum and maximum amplitude values for that interval. The color of the box indicates the frequency range for the average frequency. Thus the first box of the display of FIG. 4 shows that for the first displayed time interval having the indicated amplitude range the average frequency was between f1 and f2.

Thus the present invention provides a single display for amplitude/frequency history of an input signal by dividing the time axis into time intervals and determining for each interval the minimum and maximum amplitude values as well as the average frequency value, where the display is in the form of amplitude range versus time boxes, the color of each box indicating the average frequency.

What is claimed is:

1. A method of processing a history of data values, each data value having a time value, a frequency value and an amplitude value for an input signal, comprising the steps of:
    formatting the data values for display to produce for each of a plurality of time intervals of the history, each time interval defining a range of the time values, minimum and maximum amplitude values and an average frequency value; and
    displaying the formatted data such that the minimum and maximum amplitude values are represented by distances above a time axis with a length equal to the time interval to form a box, and the average frequency value is represented by one of a plurality of intensity data values that fills the box, each intensity data value representing a specified range of frequencies.

2. The method of claim 1 wherein the formatting step for each time interval comprises the steps of:
    determining a range of rows in a frame buffer to represent the minimum amplitude to maximum amplitude values;
    determining a range of columns in the frame buffer to represent the time interval;
    determining an intensity value to represent the average frequency; and
    storing the intensity value at the locations in the frame buffer addressed by the range of columns and rows.

3. The method of claim 2 wherein the intensity data value represents a displayable color.

4. The method of claim 2 wherein the intensity data value represents a displayable grey tone.

* * * * *